United States Patent
Inoue et al.

(10) Patent No.: US 7,054,548 B2
(45) Date of Patent: May 30, 2006

(54) VIBRATION-FLOW-TYPE HEATING-BODY COOLING DEVICE

(75) Inventors: Seiji Inoue, Aichi-pref. (JP); Kenichi Nara, Nagoya (JP); Kimio Kohara, Nagoya (JP); Shigeru Kadota, Oobu (JP); Nobunao Suzuki, Toyohashi (JP); Yukinori Hatano, Okazaki (JP); Fumiaki Nakamura, Kariya (JP); Nobuyoshi Okada, Takahama (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 11/179,961

(22) Filed: Jul. 12, 2005

(65) Prior Publication Data

US 2006/0011332 A1    Jan. 19, 2006

(30) Foreign Application Priority Data

Jul. 14, 2004    (JP)    ............................. 2004-207283

(51) Int. Cl.
*F28D 7/00* (2006.01)

(52) U.S. Cl. ...................... 392/496; 392/465; 392/466; 165/42; 165/61; 165/172

(58) Field of Classification Search ................. 392/496
See application file for complete search history.

(56) References Cited

U.S. PATENT DOCUMENTS 6,655,450 B1    12/2003    Nishio et al.

FOREIGN PATENT DOCUMENTS

| JP | 2000-216314 | 8/2000 |
|---|---|---|
| JP | 2001-227885 | 8/2001 |
| JP | 2002-364991 | 12/2002 |
| JP | 2003-38930 | 2/2003 |

OTHER PUBLICATIONS

Technology Exhibition Guide Book of Provision for Thermal Problems, Apr. 2001, with partial English translation: p. 43-44.

*Primary Examiner*—Thor S. Campbell
(74) *Attorney, Agent, or Firm*—Harness, Dickey & Pierce, PLC (57) ABSTRACT

The central position of each heating body 1 in the fluid flow direction is referred to as a heating body central position, the central position of a heat radiating section 33a located between the neighboring heating bodies 1 in the fluid flow direction is referred to as a heat radiating section central position, the end of a heat radiating section 33b connected to a pump 6 on the opposite side of a heat absorbing section is referred to as a heat radiating section front, the distances along the fluid flow from the heating body central position to the heat radiating section central position are referred to as heat transport distances and the distances from the heating body central position to the heat radiating section front are referred to as heat transport distances. S>=the maximum heat transport distance Lmax holds. Lmax is the longest of the heat transport distances.

12 Claims, 10 Drawing Sheets

VIBRATION-FLOW-TYPE HEATING-BODY COOLING DEVICE

BACKGROUND OF THE INVENTION

1. Field of the Invention

The present invention is preferably applicable to a cooling device for cooling an electric apparatus such as an integrated circuit for a computer, a transmitting/receiving modem for processing signals transmitted and received between a mobile phone and its nearest central exchange office, a transmission amplifier for amplifying electromagnetic waves to be transmitted to a mobile phone, an IGBT (power transistor), and an inverter for controlling an industrial motor.

2. Description of the Related Art

Conventionally, as a cooling device for cooling a heating body such as an electric apparatus, a circulation-flow-type cooling device, which circulates a fluid through a channel to cool a heating body, is widely known.

Further, a vibration-flow-type cooling device has been proposed, which comprises a tube provided with a plurality of channels in parallel through which a fluid flows and a pump for causing a vibration flow to occur in a fluid, and which uses a forced-vibration-flow-type heat pipe for cooling a heating body by vibrating (reciprocating) a fluid within the channel. As a vibration-flow-type cooling device, a meandering-channel system in which fluids vibrate in opposite phases in neighboring channels and a parallel channel system in which fluids vibrate in the same phase have been proposed (for example, refer to Patent document 1, Non-patent document 1).

[Patent Document 1]
Japanese Unexamined Patent Publication (Kokai) No. 2002-364991

[Non-patent Document 1]
"Thermal Management Technique Exhibition Guidebook (2001 Ver.)" pages 41 to 46

However, there has been a problem that a vibration-flow-type cooling device is inferior to a circulation-flow-type cooling device in cooling performance.

SUMMARY OF THE INVENTION

The above problem being taken into consideration, the object of the present invention is to improve the cooling performance of a vibration-flow-type cooling device.

In order to attain the above-mentioned object, a heating body cooling device according to a first aspect of the present invention is characterized by comprising tubes (3) provided with a plurality of channels (31) in parallel through which fluids flow and a pump (6), connected to both ends of the tubes (3), for causing vibration flows to occur in the fluids, wherein the tubes (3) have heat absorbing sections (32) for transferring the heat of a heating body (1) to the fluids and heat radiating sections (33) located on both sides of the heat absorbing section (32) for radiating the heat of the fluids to the outside, the fluids vibrate with an amplitude S within the channels (31) for transporting heat, the heating body (1) is arranged at one place in the fluid flow direction, and if it is assumed that the central position of the heating body (1) in the fluid flow direction is referred to as a heating body central position, the end of the heat radiating section (33) on the opposite side of the heat absorbing section is referred to as a heat radiating section front, the distance along the fluid flow from the heating body central position to the heat radiating section front is referred to as a heat transport distance, and the longer of the two heat transport distances is referred to as a maximum heat transport distance Lmax, then S>=Lmax holds.

According to this, as the fluid moves without fail from the heat absorbing section to the heat radiating section front, the entire area of the heat radiating section is effectively used for heat radiation. As a result, it is possible to improve the cooling performance of the vibration-flow-type cooling device, in which the heating body is arranged at one place in the fluid flow direction, to the same level as that of the circulation flow type cooling device.

A heating body cooling device according to a second aspect of the present invention is characterized by comprising tubes (3) provided with a plurality of channels (31) in parallel through which fluids flow and a pump (6) connected to both ends of the tubes (3) for causing vibration flows to occur in the fluids, wherein the tubes (3) have heat absorbing sections (32) for transferring the heat of a heating body (1) to the fluids and heat radiating sections (33) located on both sides of the heat absorbing section (32) for radiating the heat of the fluids to the outside, the fluids vibrate with an amplitude S within the channels (31) for transporting heat, the heating body (1) is arranged at one place in the fluid flow direction, and if it is assumed that the central position of the heating body (1) in the fluid flow direction is referred to as a heating body central position, the end portion of the heat radiating section (33) on the opposite side of the heat absorbing section is referred to as a heat radiating section front, the distance along the fluid flow from the heating body central position to the heat radiating section front is referred to as a heat transport distance, and the longer of the two heat transport distances is referred to as a maximum heat transport distance Lmax, then S>=0.7 Lmax holds.

Accordingly, as the fluid moves from the heat absorbing section to the vicinity of the heat radiating section front, almost the entire area of the heat radiating section is effectively used for heat radiation. As a result, it is possible to improve the cooling performance of the vibration-flow-type cooling device, in which the heating body is arranged at one place in the fluid direction of the fluid, to nearly the same level as that of the circulation flow type cooling device.

A heating body cooling device according to a third aspect of the present invention is characterized by comprising tubes (3) provided with a plurality of channels (31) in parallel through which fluids flow and a pump (6), connected to both ends of the tubes (3), for causing vibration flows to occur in the fluids, wherein the tubes (3) have heat absorbing sections (32) for transferring the heat of heating bodies (1) to the fluids and heat radiating sections (33) located on both sides of the heat absorbing section (32) for radiating the heat of the fluids to the outside, the fluids vibrate with an amplitude S within the channels (31) for transporting heat, the heating bodies (1) are arranged at plural places in the fluid flow direction, and if it is assumed that the central position of each heating body (1) in the fluid flow direction is referred to as a heating body central position, the central position of the heat radiating section (33a), among the heat radiating sections (33), located between the neighboring heating bodies (1) in the fluid flow direction is referred to as a heat radiating section central position, the end of the heat radiating section (33b), among the heat radiating sections (33), connected to the pump (6) on the opposite side of the heat absorbing section is referred to as a heat radiating section front, the distance along the fluid flow from the heating body central position to the heat radiating section central position and the distance from the heating body central position to the heat radiating section front are referred to as heat transport distances, and the longest of the plural heat transport distances is referred to as a maximum heat transport distance Lmax, then S>=Lmax holds.

According to this, as the fluid moves without fail from the heat absorbing section to the heat radiating section central position or the heat radiating section front, the entire area of the heat radiating section is used effectively for heat radiation. As a result, it is possible to improve the cooling performance of the vibration-flow-type cooling device, in which the heating bodies are arranged at plural places in the fluid flow direction, to the same level as that of the circulation flow type cooling device.

A heating body cooling device according to a fourth aspect of the present invention is characterized by comprising tubes (3) provided with a plurality of channels (31) in parallel through which fluids flow and a pump (6), connected to both ends of the tubes (3), for causing vibration flows to occur in the fluids, wherein the tubes (3) have heat absorbing sections (32) for transferring the heat of heating bodies (1) to the fluids and heat radiating sections (33) located on both sides of the heat absorbing section (32) for radiating the heat of the fluids to the outside, the fluids vibrate with an amplitude S within the channels (31) for transporting heat, the heating bodies (1) are arranged at plural places in the fluid flow direction, and if it is assumed that the central position of each heating body (1) in the fluid flow direction is referred to as a heating body central position, the central position of the heat radiating section (33a), among the heat radiating sections (33), located between the neighboring heating bodies in the fluid flow direction is referred to as a heat radiating section central position, the end of the heat radiating section (33b), among the heat radiating sections (33), connected to the pump (6) on the opposite side of the heat absorbing section is referred to as a heat radiating section front, the distance along the fluid flow from the heating body central position to the heat radiating section central position and the distance from the heating body central position to the heat radiating section front are referred to as heat transport distances, and the longest of the plural heat transport distances is referred to as a maximum heat transport distance Lmax, then S>=0.7 Lmax holds.

According to this, as the fluid moves from the heat absorbing section to the vicinity of the heat radiating section central position or the heat radiating section front, almost the entire area of the heat radiating section is used effectively for heat radiation. As a result, it is possible to improve the cooling performance of the vibration-flow-type cooling device, in which the heating bodies are arranged at plural places in the fluid flow direction, to nearly the same level as that of the circulation flow type cooling device.

A fifth aspect of the present invention is characterized in that there exist portions at which fluids vibrate in the same phase within neighboring channels among the plurality of channels (31).

If the meandering channel system and the parallel channel system of a vibration flow type cooling device are compared, the meandering channel system is superior to the other in cooling performance, however, in the case of the meandering channel system, it is necessary to configure channels so that a fluid flows in a channel in opposite phase to that of the fluid in its neighboring channel, resulting in a complicated structure and a large pressure loss. As a countermeasure to this, a method for manufacturing the end of a channel etc. is proposed in Japanese Unexamined Patent Publication (Kokai) No. 2001-227885 and Japanese Unexamined Patent Publication (Kokai) No. 2000-216314. However, such a structure is still complicated, to a certain extent, because it is necessary to cause to a fluid to flow in a channel in opposite phase to that of the flow in its neighboring channel and a problem of cost and productivity still persists.

In contrast to this, according to the fifth aspect of the present invention, as the parallel channel system is employed, in which there exist portions at which fluids vibrate in the same phase in neighboring channels, its structure is simpler than that of the meandering channel system.

A sixth aspect of the present invention is characterized by comprising headers (4) provided between tubes (3) and a pump (6) for making a plurality of channels (31) communicate with the pump (6), wherein separators (41) for dividing the internal spaces of the headers (4) into plural spaces are provided within the headers (4).

According to this, by adequately setting a communication relationship between the pump and the plurality of channels using the separator, it is possible to realize the meandering channel system in which fluids vibrate in opposite phase in neighboring channels or the parallel channel system in which a plurality of channel groups are provided, in which fluids vibrate in the same phase in neighboring channels. In this case, it is possible to make the pump compact because a lower discharge flow rate is required for the pump compared to that of the parallel channel system in which fluids vibrate in the same phase in all of the channels.

The present invention may be more fully understood from the description of the preferred embodiments of the invention set forth below, together with the accompanying drawings.

DESCRIPTION OF THE PREFERRED EMBODIMENTS

First Embodiment

Figure 1:
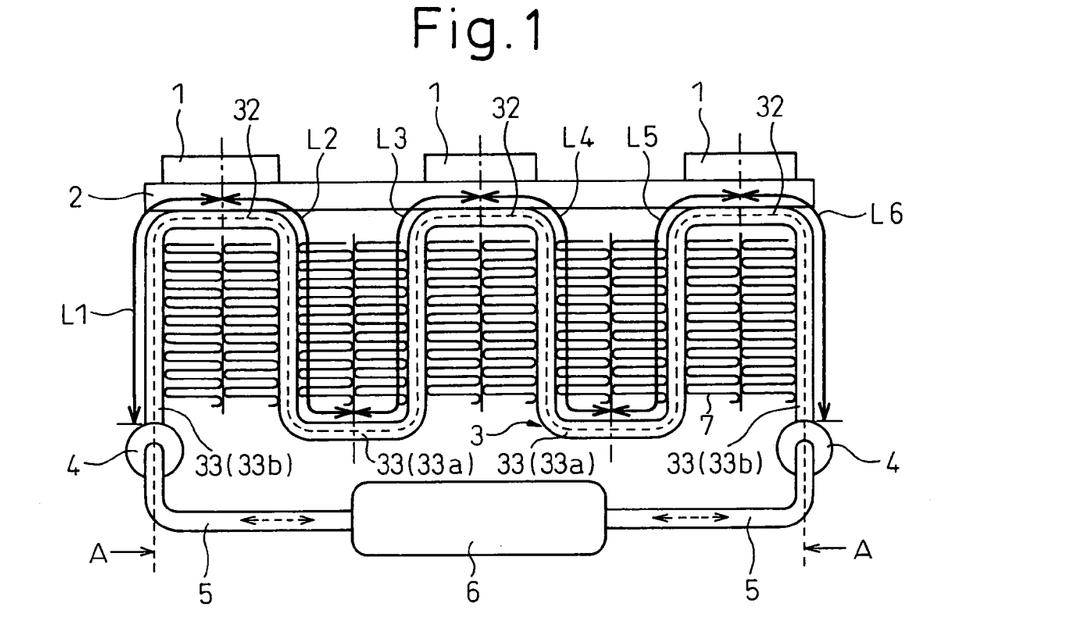
FIG. 1 is a schematic configuration diagram of a heating body cooling device according to a first embodiment of the present invention.

A first embodiment of the present invention is explained below. FIG. 1 is a schematic configuration diagram of a heating body cooling device according to the first embodiment and FIG. 2 shows an exploded view of a tube 3 in FIG. 1, that is, a section view along the line A—A in FIG. 1.

The heating-body cooling device according to the present embodiment can be applied to cooling electronic and electrical apparatuses in a mobile phone base station, electronics and electric apparatuses of various industrial equipment (for example, a power element such as IGBT used in an inverter for controlling an industrial motor), etc.

Figure 2:
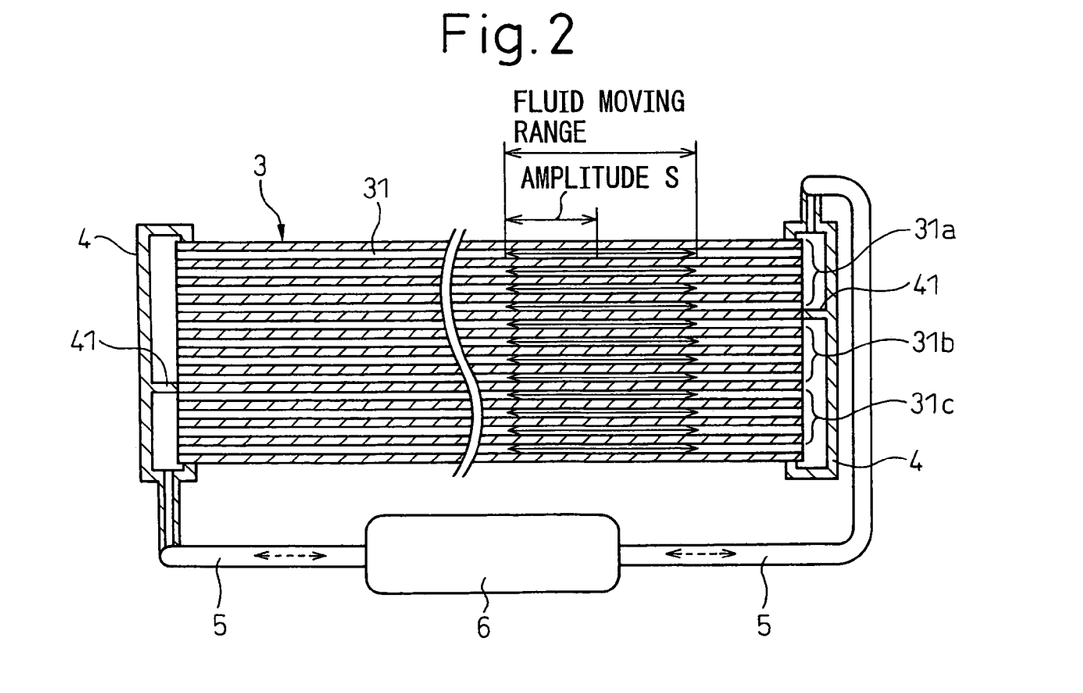
FIG. 2 is a section view along the line A—A in FIG. 1.

As shown in FIG. 1 and FIG. 2, a heating body 1 such as a heating element is mounted on a base plate 2 made of a metal material having a high heat conductivity and the base plate 2 is closely fixed to the tube 3 and due to this, the heat of the heating body 1 is transferred to the tube 3 via the base plate 2. The heating bodies 1 are arranged at three places in the fluid flow direction.

The tube 3 is made of a metal material having a high heat conductivity such as copper or aluminum, in which a plurality of channels 31, through which fluid (water, for example) flows, are provided in parallel. In the tube 3, portions opposing the heating body 1 are heat absorbing sections 32 that transfer the heat of the heating body 1 to the fluid and portions located on both sides of the heat absorbing 32 for radiating the heat of the fluid to the outside are heat radiating sections 33.

On both ends of the tube 3 in the lengthwise direction (the fluid flow direction), headers 4 (details will be described later) are provided, which form a space that is communicated with all of the channels 31 and the headers 4 are connected to a pump 6 via pipes 5. Then, the insides of the tube 3, the header 4, and the pipe 5 are filled with a fluid.

The pump 6 serves to cause a fluid to vibrate by reciprocating a plunger by, for example, an electromagnetic force and the fluid vibrates with an amplitude S within the channel 31. The range of movement of the fluid within the channel 31 is 2 S and the movement distance of the fluid per each reciprocating (vibrating) period within the channel 31 is 4 S.

To the tube 3, a heat radiating fin 7 is joined, which increases the heat transfer area with air and promotes heat exchange between the fluid within the tube 3 and cooling air (in the present embodiment, the air in a mobile phone base station). The heat radiating fin 7 is a corrugated fin and made of a metal having a high heat conductivity, such as aluminum or copper.

Within the header 4, a separator 41 for dividing the internal space of the header 4 into plural spaces is provided. The plurality of channels 31 are divided into three channel groups 31a to 31c by the separator 41. Each of the channel groups 31a to 31c is a collection of plural channels in which the fluids vibrate in the same phase in neighboring channels. Then, the fluid in the first channel group 31a and the fluids in the third channel group 31c vibrate in the same phase and the fluids in the second channel group 31b and the fluids in the other channel groups 31a and 31c vibrate in opposite phase. The heating-body cooling device in the present embodiment is a parallel channel system in which the fluid vibrates in the same phase.

The heating-body cooling device according to the present embodiment is a cooling device of a forced-vibration-flow type utilizing the diffusion promotion effect (refer to Japanese Unexamined Patent Publication (Kokai) No. 2002-364991 etc.) and when the fluid is vibrated (reciprocated) by the pump 6, the heat of the heating body 1 transferred to the fluid in the heat absorbing section 32 is transported to the heat radiating section 33 and the heat is dissipated to the surrounding air via the heat radiating fin 7. Thus the heating body 1 is cooled.

Next, the cooling performance of the vibration-flow-type cooling device according to the present embodiment is evaluated using the amplitude S as a parameter. The evaluation results are explained below.

Firstly, the terms used in the following explanation are defined. The central position of each heating body 1 in the fluid flow direction is defined as the heating body central position. The central position of the heat radiating section 33a, among the heat radiating sections 33, located between neighboring heating bodies 1 in the fluid flow direction is defined as the heat radiating section central position. The end of the heat radiating section 33b, among the heat radiating sections 33, on the opposite side of the heat absorbing section 32, to be connected to the pump 6 via the header 4 and the pipe 5, that is, the portion connected to the header 4, is defined as the heat radiating section front.

The distances along the fluid flows from the heating body central positions to the heat radiating section central positions and the distances along the fluid flows from the heating body central positions to the heat radiating section fronts are defined as the heat transport distances L1 to Ln. The longest heat transport distance among the plural heat transport distances L1 to Ln is defined as the maximum heat transport distance Lmax.

The specifications of the vibration-flow-type cooling device used for the evaluation are as follows. The heating bodies 1 are arranged at three places in the fluid flow direction as shown in FIG. 1. The heat transport distances L1 to L6 are each 120 mm long, therefore, Lmax=120 mm. The channels 31 are divided into seven channel groups and each channel group includes nine channels. The fluid is vibrated at 0.5 Hz.

Figure 3:
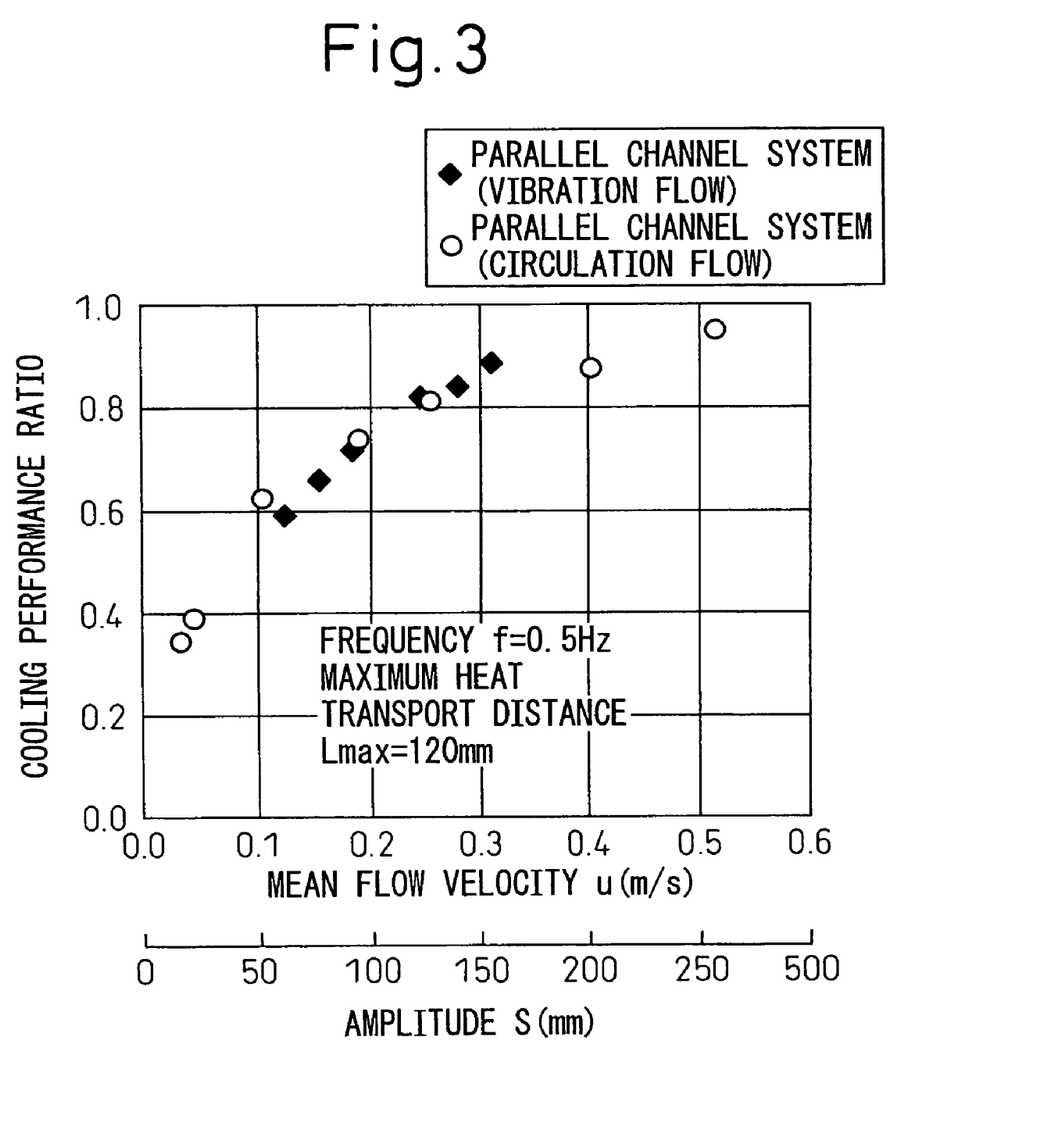
FIG. 3 is a diagram showing the cooling performance of a vibration-flow-type cooling device according to the first embodiment.

FIG. 3 shows the evaluation results. In FIG. 3, the vertical axis represents the ratio of the cooling performance to the standard cooling performance, where the cooling performance of the circulation-flow-type cooling device (hereinafter, referred to the standard cooling performance) is one, when the flow rate of the fluid is infinity in the circulation-flow-type cooling device. The horizontal axis represents the average flow velocity u of the fluid within the tube 3 in the circulation-flow-type cooling device and the vibration-flow-type cooling device and the amplitude S of the vibration-flow-type cooling device.

As is obvious from FIG. 3, when S>=Lmax, it was confirmed that the cooling performance of the vibration-flow-type cooling device is improved to the same level as that of the circulation flow type cooling device. This is because when S>=Lmax, the fluid moves without fail from the heat absorbing section 32 to the heat radiating section central position or the heat radiating section front and the entire area of the heat radiating section 33 is effectively utilized for radiating heat.

As described above, by setting S>=Lmax, it is possible to improve the cooling performance of the vibration-flow-type cooling device, in which the heating bodies 1 are arranged at plural places in the fluid flow direction, to the same level as that of the circulation flow type cooling device.

As the cooling device in the present embodiment is the parallel channel system in which there are portions at which the fluids vibrate in the same phase in neighboring channels, the structure is simpler than that of the meandering channel system.

As the cooling device in the present embodiment is the parallel channel system in which plural channel groups 31a to 31c in which the fluids vibrate in the same phase in neighboring channels, the discharge flow rate from the pump 6 can be lower than that of the parallel channel system in which the fluids vibrate in the same phase in all of the channels, and therefore, the pump 6 can be made compact.

Second Embodiment

Figure 4:
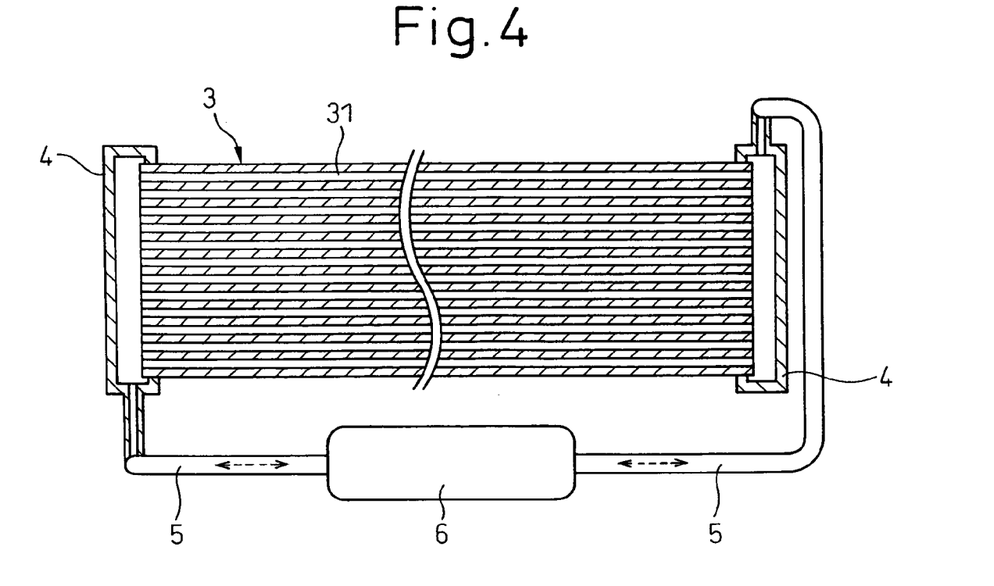
FIG. 4 is a schematic section view of a heating body cooling device according to a second embodiment of the present invention.

The second embodiment of the present invention is explained below. FIG. 4 is a schematic section view of a heating body cooling device according to the second embodiment and the tube 3 is shown in its exploded view. The same symbols are attached to the parts the same as or similar to those in the first embodiment and the explanation thereof is omitted here.

As shown in FIG. 4, in the present embodiment, the separator 41 within the header 4 in the first embodiment is not used and the parallel channel system is employed in which the fluids vibrate in the same phase in all of the channels 31.

In the cooling device in the present embodiment also, by setting S>=Lmax, it is possible to improve the cooling performance to the same level as that of the circulation-flow-type cooling device. Further, the structure of the header 4 can be simplified.

Third Embodiment

Figure 5:
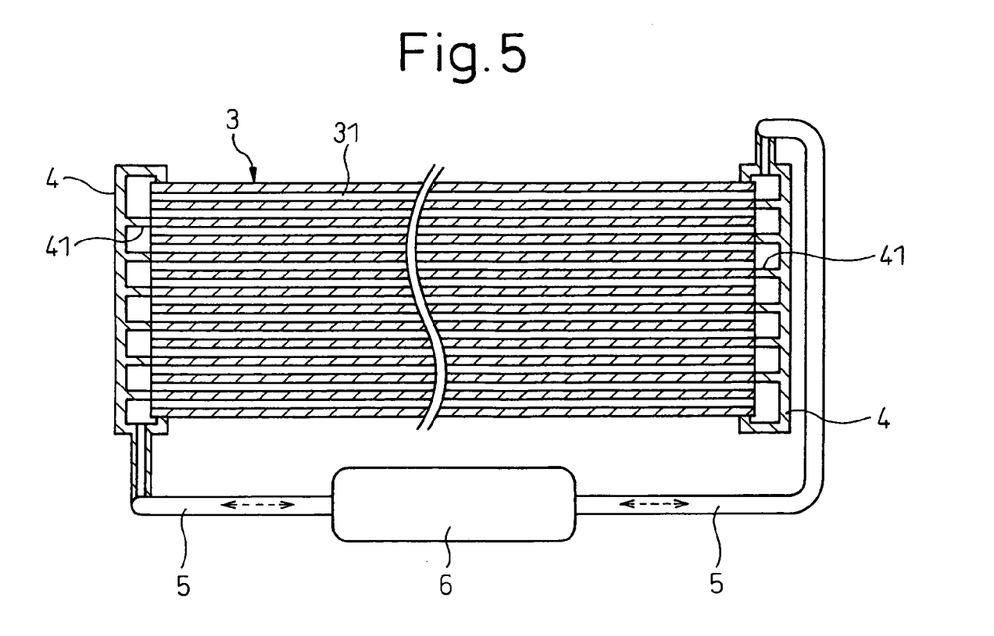
FIG. 5 is a schematic section view of a heating body cooling device according to a third embodiment of the present invention.

The third embodiment of the present invention is explained below. FIG. 5 is a schematic section view of a heating-body cooling device according to the third embodiment and the tube 3 is shown in its exploded view. The same symbols are attached to the parts the same as or similar to those in the first embodiment and the explanation thereof is omitted here.

As shown in FIG. 5, in the present embodiment, the number of the separators 41 within the header 4 in the first embodiment is increased and the meandering channel system is employed in which the fluids vibrate in opposite phase in neighboring channels 31.

In the cooling device in the present embodiment also, by setting S>=Lmax, it is possible to improve the cooling performance to the same level as that of the circulation-flow-type cooling device.

Fourth Embodiment

Figure 6:
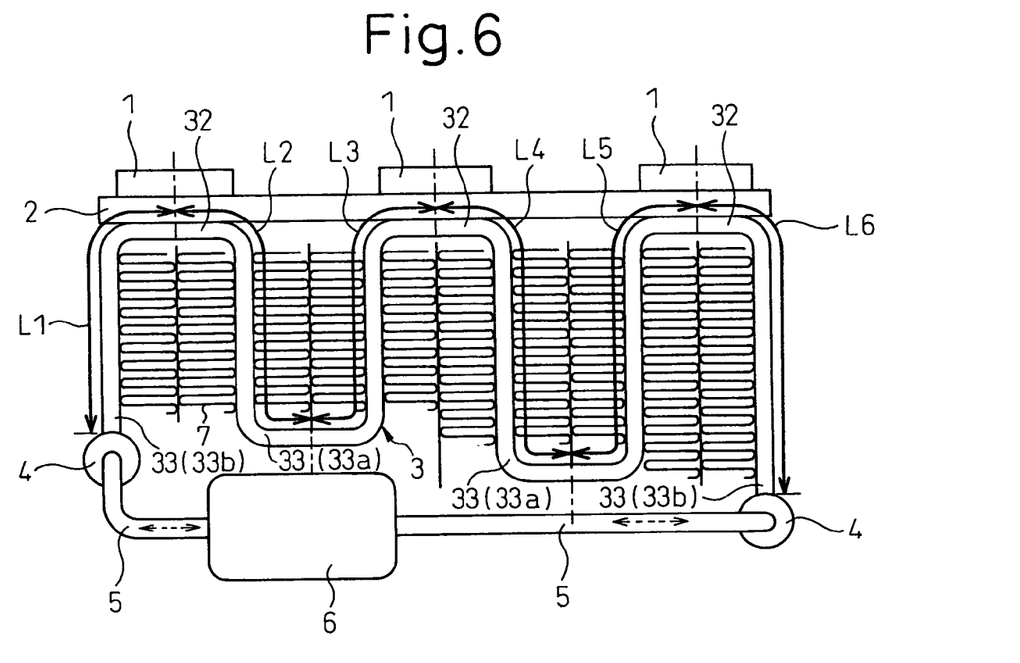
FIG. 6 is a schematic configuration diagram of a heating body cooling device according to a fourth embodiment of the present invention.

The fourth embodiment of the present invention is explained below. FIG. 6 is a schematic configuration diagram of a heating-body cooling device according to the fourth embodiment. The same symbols are attached to the parts the same as or similar to those in the first embodiment and the explanation thereof is omitted here.

As shown in FIG. 6, in the present embodiment, the length of each heat radiating section 33 differs from each another because of the position at which the pump 6 is arranged and the heat transport distances L1 to L6 are different accordingly.

In this case, if the longest heat transport distance (in the present embodiment, L4 and L5) is employed as the maximum heat transport distance Lmax, the cooling performance can be most improved and by setting S>=Lmax, it is possible to improve the cooling performance to the same level as that of the circulation-flow-type cooling device.

Fifth Embodiment

Figure 7:
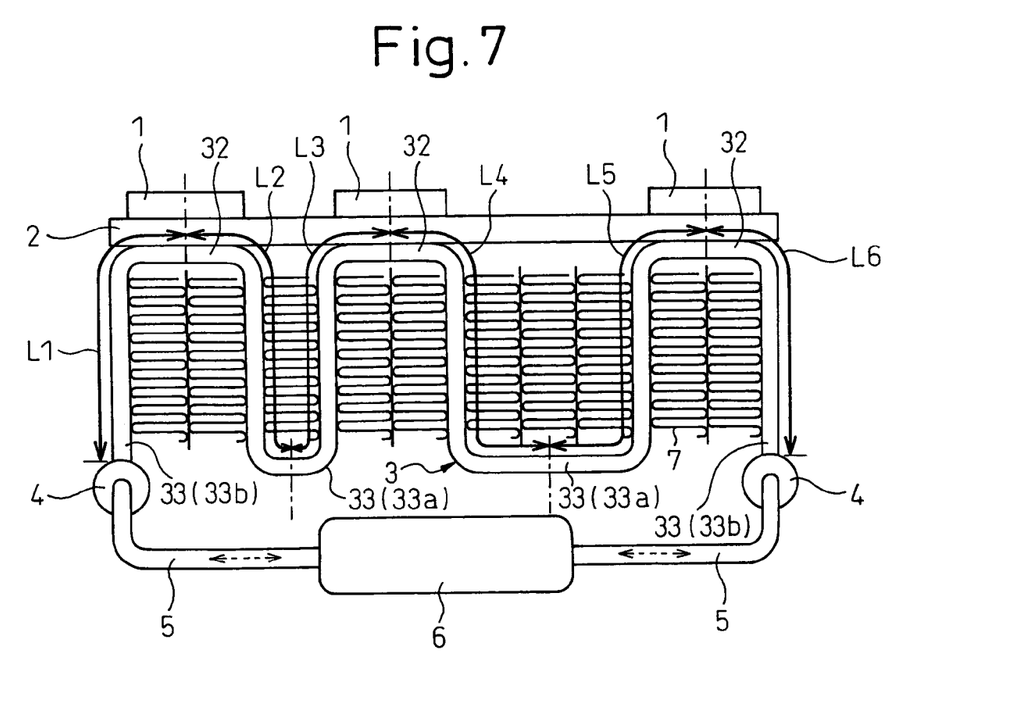
FIG. 7 is a schematic configuration diagram of a heating body cooling device according to a fifth embodiment of the present invention.

The fifth embodiment of the present invention is explained below. FIG. 7 is a schematic configuration diagram of a heating-body cooling device according the fifth embodiment. The same symbols are attached to the parts the same as or similar to those in the first embodiment and the explanation thereof is omitted here.

As shown in FIG. 7, in the present embodiment, the length of each heat radiating section 33 differs because of the arrangement of the heating bodies 1 and the heat transport distances L1 to L6 are different accordingly.

In this case, if the longest heat transport distance (in the present embodiment, L4 and L5) is employed as the maximum heat transport distance Lmax, the cooling performance can be most improved and by setting S>=Lmax, it is possible to improve the cooling performance to the same level as that of the circulation-flow-type cooling device.

Sixth Embodiment

Figure 8:
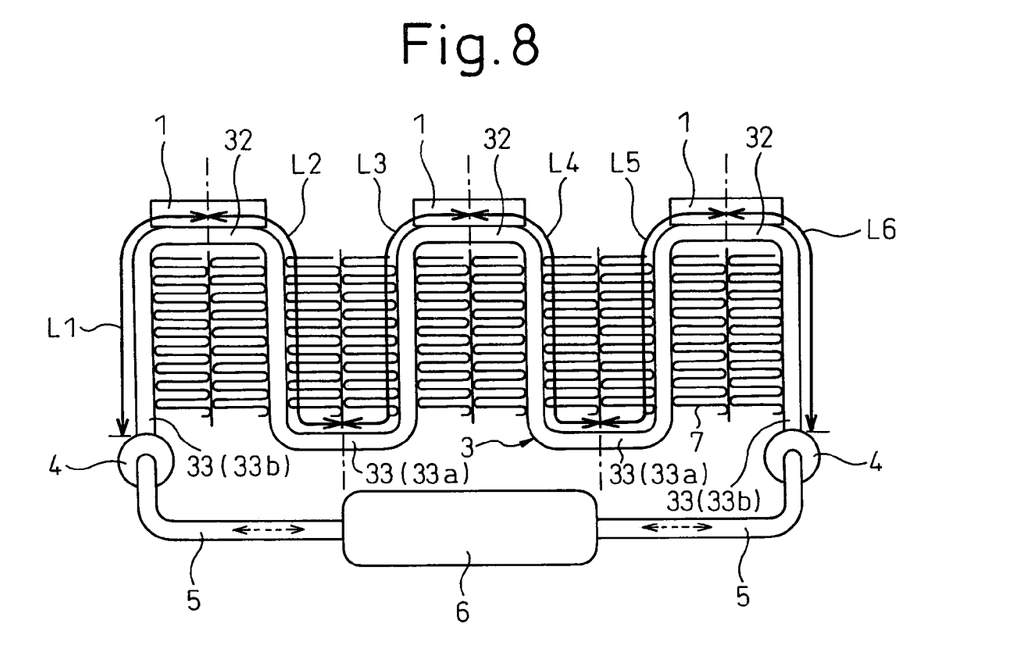
FIG. 8 is a schematic configuration diagram of a heating body cooling device according to a sixth embodiment of the present invention.

The sixth embodiment of the present invention is explained below. FIG. 8 is a schematic configuration diagram of a heating-body cooling device according the sixth embodiment. The same symbols are attached to the parts the same as or similar to those in the first embodiment and the explanation thereof is omitted here.

In the configuration according to the first embodiment, the heating bodies 1 are mounted on the base plate 2 and the base plate 2 is joined to the tube 3, but in the configuration according to the present embodiment, the heating bodies 1 are joined directly to the flat portion of the tube 3 as shown in FIG. 8. Due to this, the thermal resistance of the base plate 2 is eliminated and therefore the cooling performance is improved and an advantage in cost can be obtained.

Seventh Embodiment

Figure 9:
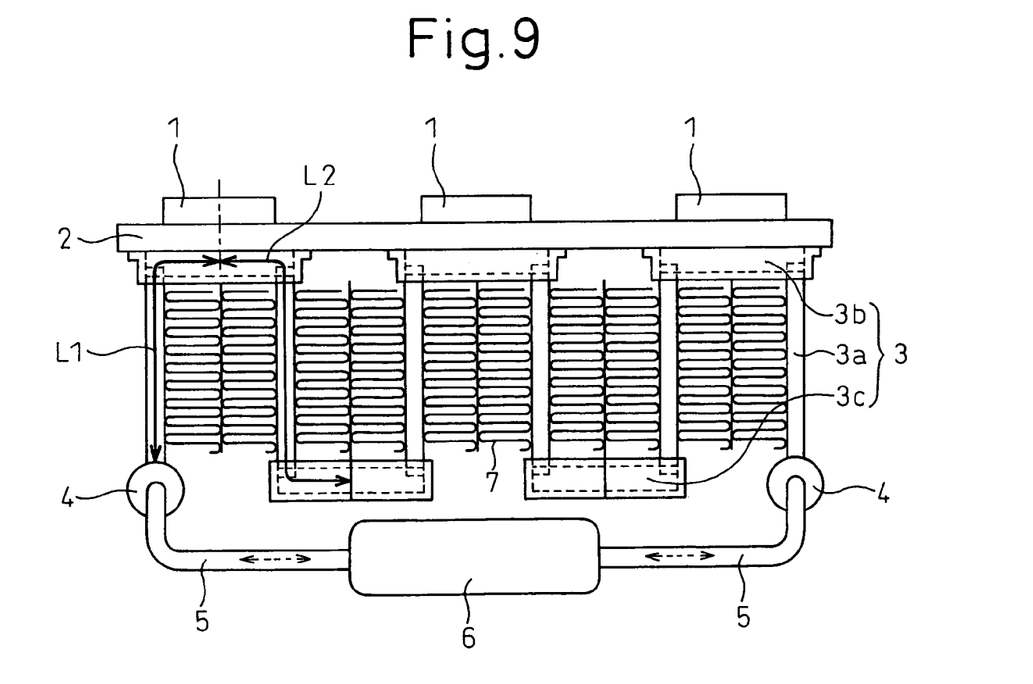
FIG. 9 is a schematic configuration diagram of a heating body cooling device according to a seventh embodiment of the present invention.

The seventh embodiment of the present invention is explained below. FIG. 9 is a schematic configuration diagram of a heating-body cooling device according the seventh embodiment. The same symbols are attached to the parts the same as or similar to those in the first embodiment and the explanation thereof is omitted here.

In the configuration according to the first embodiment, the flat portion of the bent tube 3 is joined to the base plate 2, but in the configuration according to the present embodiment, as shown in FIG. 9, the tube 3 comprises a rectilinear tube member 3a, a rectangular parallelepiped heat absorbing side joining member 3b, and a rectangular parallelepiped heat radiating side joining member 3c, and the heat absorbing side joining member 3b is joined to the base plate 2. However, it is desirable that a dividing member, that functions similarly to the separator within the header, is arranged within the joining members 3b and 3c.

In this manner, as the pitches between the tube members 3a are not restricted by the curvature R, it also becomes possible to increase the number of tubes and therefore the cooling performance can be improved.

Eighth Embodiment

Figure 10:
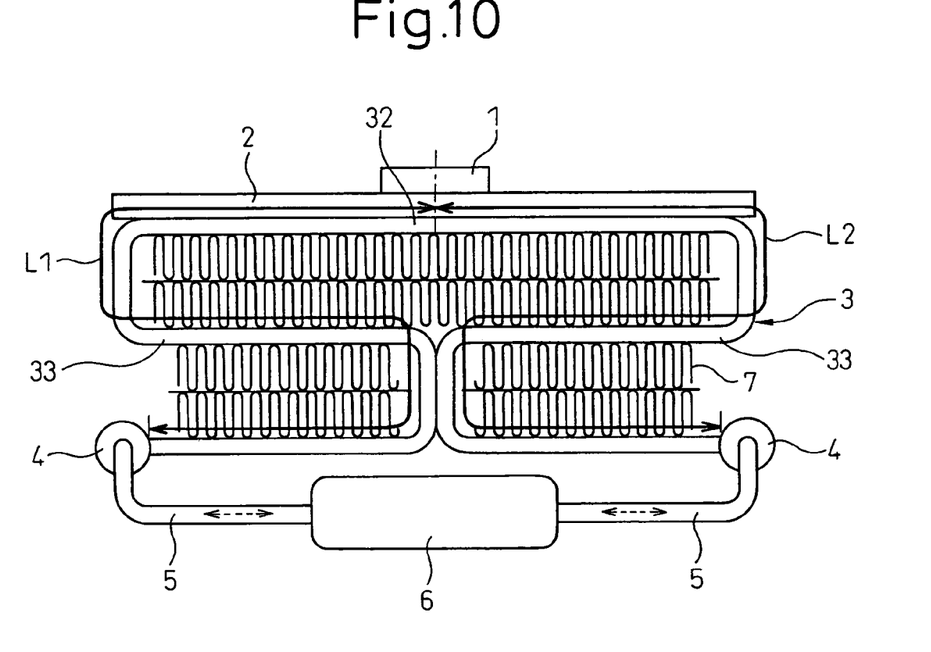
FIG. 10 is a schematic configuration diagram of a heating body cooling device according to an eighth embodiment of the present invention.

The eighth embodiment of the present invention is explained below. FIG. 10 is a schematic configuration diagram of a heating body cooling device according to the eighth embodiment. The same symbols are attached to the parts the same as or similar to those in the first embodiment and the explanation thereof is omitted here.

In the first embodiment, an example in which the tube 3 is arranged in the direction substantially vertical to the base plate 2 is shown, but a configuration is possible in which the tube 3 is arranged substantially parallel to the base plate 2. In this case, as the contact area between the base plate 2 and the tube 3 increases, the thermal resistance at the portion can be reduced.

Next, the cooling performance of the vibration-flow-type cooling device employing the parallel channel system according to the present embodiment and the cooling performance of the vibration-flow-type cooling device employing the meandering channel system according to the present embodiment are evaluated with the amplitude S as a parameter.

The specifications of the vibration-flow-type cooling device used in the evaluation are as follows. The heating body 1 is arranged at one place in the fluid flow direction as shown in FIG. 10 and, at the same time, is arranged at the center on the base plate 2 in the fluid flow direction. Both the heat transport distances L1 and L2 are 400 mm and, therefore, Lmax=400 mm. The fluid is vibrated at 0.5 Hz. The channels 31 of the vibration-flow-type cooling device employing the parallel channel system are divided into seven channel groups and each channel group includes nine channels.

Figure 11:
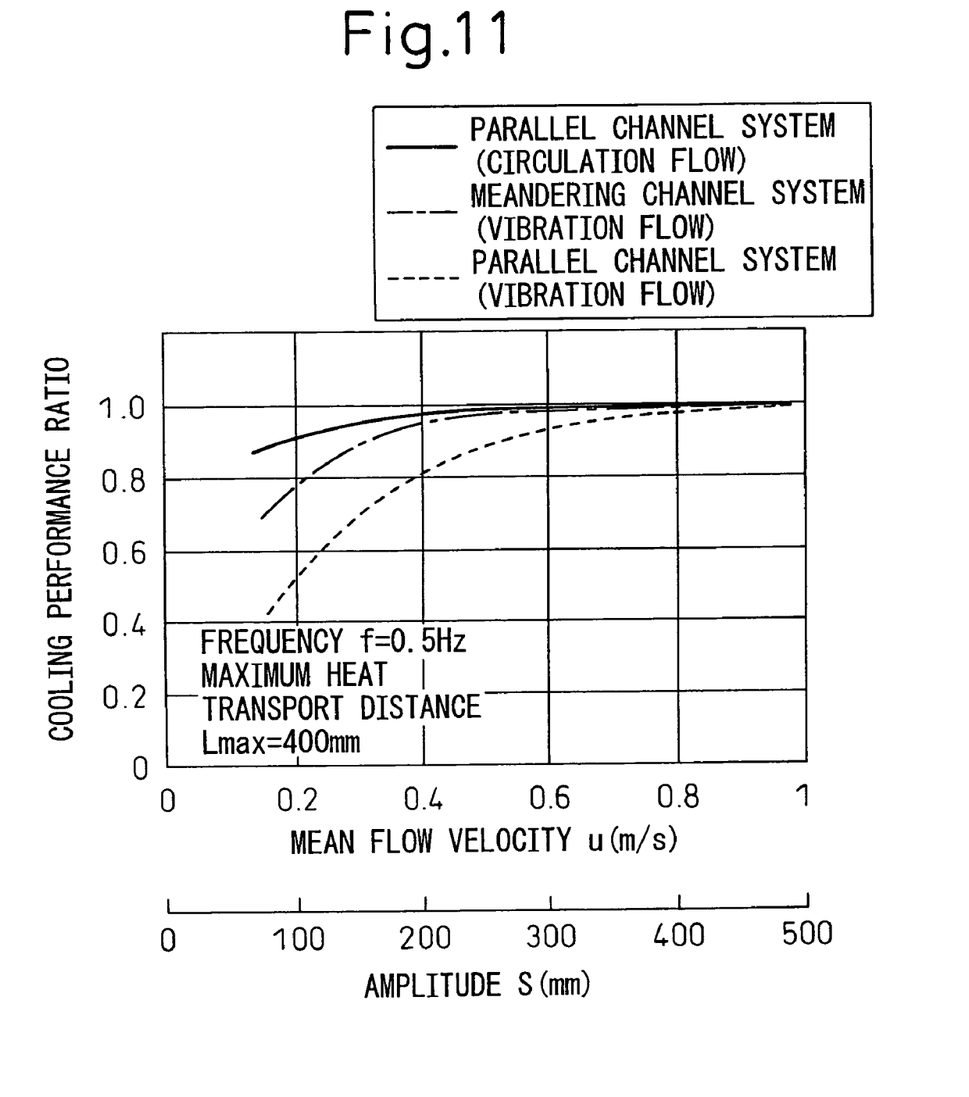
FIG. 11 is a diagram showing the cooling performance of a vibration-flow-type cooling device according to the eighth embodiment.

FIG. 11 shows the evaluation results. In FIG. 11, the vertical axis represents the ratio of the cooling performance to the standard cooling performance, where the cooling performance of the circulation-flow-type cooling device (hereinafter, referred to as the standard cooling performance) is one, when the flow rate of fluid is infinity in the circulation-flow-type cooling device. The horizontal axis represents the average flow velocity u of the fluid within the tube 3 in the circulation-flow-type cooling device and the vibration-flow-type cooling device and the amplitude S of the vibration-flow-type cooling device.

As is obvious from FIG. 11, the cooling performance of the vibration-flow-type cooling device substantially saturates when S>=Lmax and the difference in the cooling performance between the parallel channel system and the meandering channel system disappears.

Further, it has been confirmed that the cooling performances of the vibration-flow-type cooling device employing the parallel channel system and the vibration-flow-type cooling device employing the meandering channel type can be improved, to the same level as that of the circulation flow type cooling device, when S>=Lmax.

It is desirable that S>=Lmax, but as can be seen from FIG. 11, when the amplitude S is about 0.7 times the maximum heat transport distance Lmax (S=about 0.7 Lmax), it is possible for the vibration-flow-type cooling device employing the parallel channel system to ensure a performance of 90% or more of the cooling performance of the circulation-flow-type cooling device. In a practical use, this is sufficiently useful and, therefore, S>=0.7 Lmax can be said to be sufficiently practical. As for the vibration-flow-type cooling device employing the meandering channel system, S>=0.7 Lmax is sufficiently practical.

Ninth Embodiment

Figure 12:
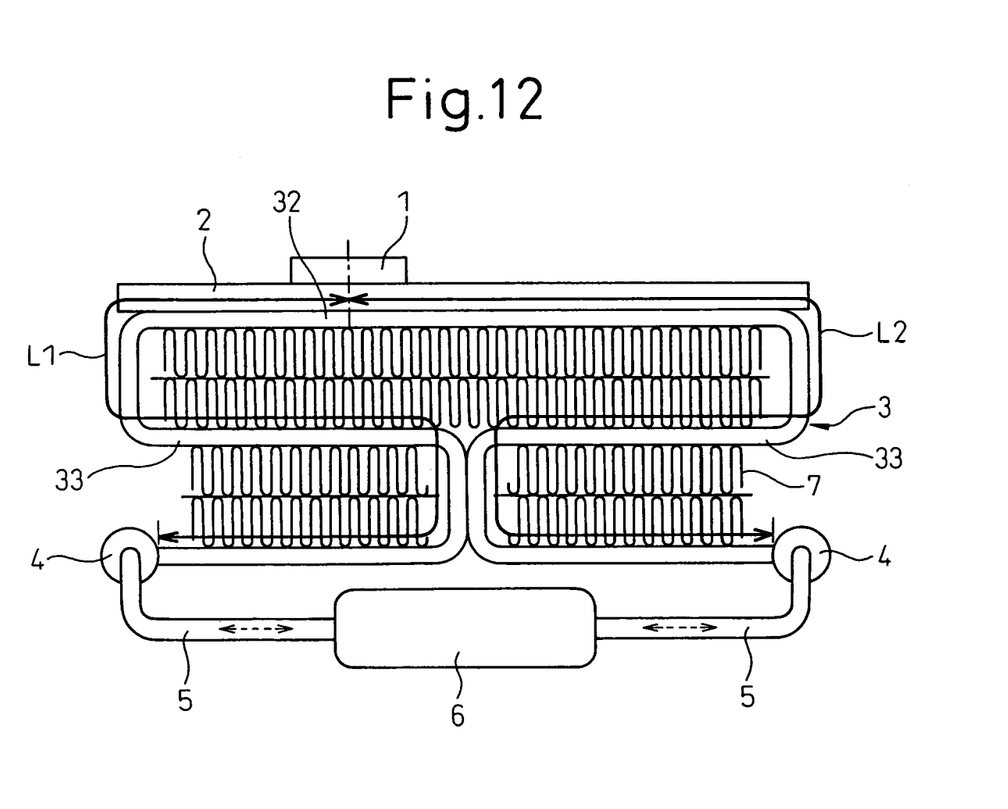
FIG. 12 is a schematic configuration diagram of a heating body cooling device according to a ninth embodiment of the present invention.

The ninth embodiment of the present invention is explained below. FIG. 12 is a schematic configuration diagram of a heating-body cooling device according to the ninth embodiment. The same symbols are attached to the parts the same as or similar to those in the eighth embodiment (refer to FIG. 10) and the explanation thereof is omitted here.

As shown in FIG. 12, in the present embodiment, the heating body 1 is arranged at a position offset toward one side in the fluid flow direction on the base plate 2. The heat transport distances L1 and L2 are different accordingly.

In this case, if the longer heat transport distance (in the present embodiment, L2) is employed as the maximum heat transport distance Lmax, the cooling performance can be most improved and by setting S>=Lmax, it is possible to improve the cooling performance to the same level as that of the circulation-flow-type cooling device.

Tenth Embodiment

Figure 13:
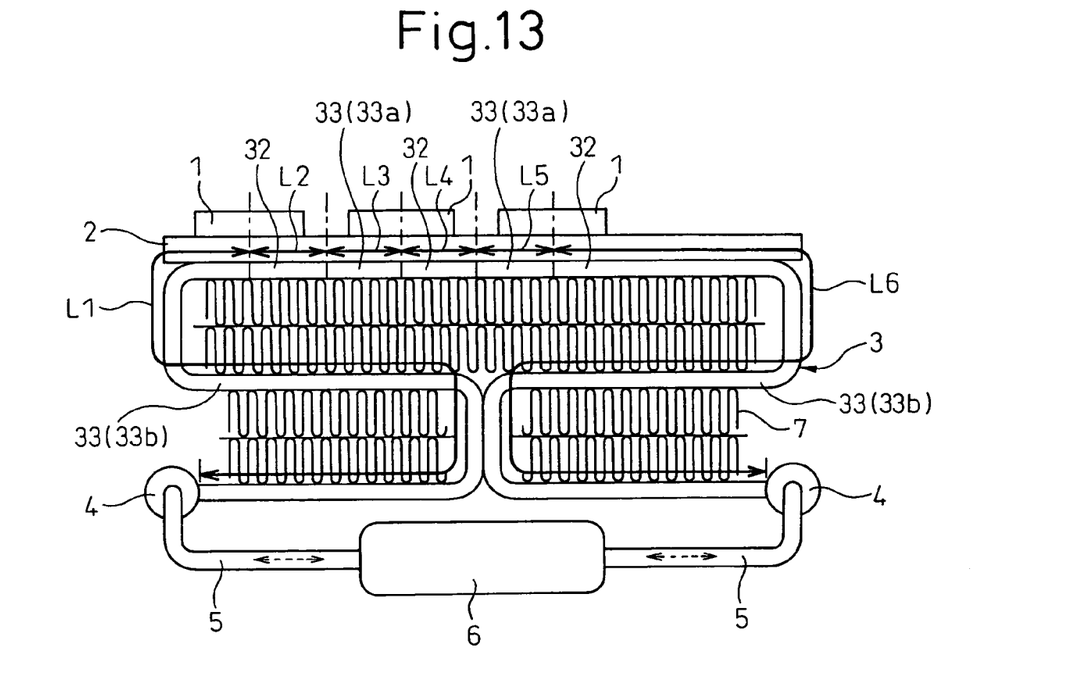
FIG. 13 is a schematic configuration diagram of a heating body cooling device according to a tenth embodiment of the present invention.

The tenth embodiment of the present invention is explained below. FIG. 13 is a schematic configuration diagram of a heating-body cooling device according to the tenth embodiment. The same symbols are attached to the parts the same as or similar to those in the eighth embodiment (refer to FIG. 10) and an explanation thereof is omitted here.

As shown in FIG. 13, in the present embodiment, the heating bodies 1 are arranged at positions offset toward one side in the fluid flow direction and, at the same time, are arranged at three positions in the fluid flow direction. The heat transport distances L1 to L6 are different accordingly.

In this case, if the longest heat transport distance (in the present embodiment, L6) is employed as the maximum heat transport distance Lmax, the cooling performance can be most improved and by letting S>=Lmax, it is possible to improve the cooling performance to the same level as that of the circulation-flow-type cooling device.

Eleventh Embodiment

Figure 14:
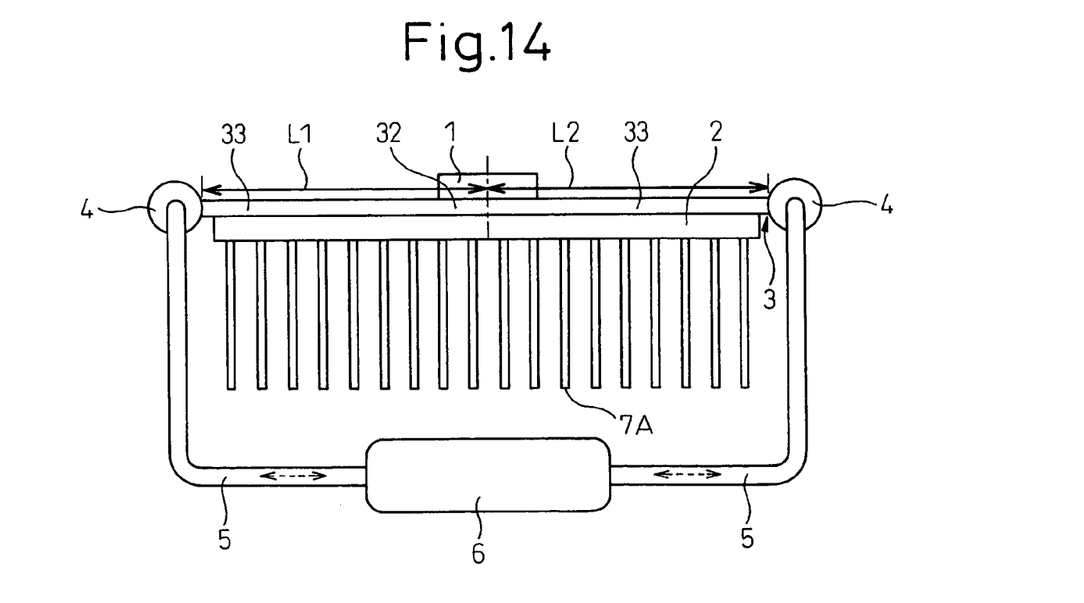
FIG. 14 is a schematic configuration diagram of a heating body cooling device according to an eleventh embodiment of the present invention.

The eleventh embodiment of the present invention is explained below. FIG. 14 is a schematic configuration diagram of a heating-body cooling device according to the eleventh embodiment. The same symbols are attached to the parts the same as or similar to those in the first embodiment and the explanation thereof is omitted here.

In the first embodiment, the heat radiating fin 7 of corrugated type is used, however, generally in a corrugated fin, the loss of pressure for cooling air passing through the fins is large, therefore, a large-sized fan is required. In contrast to this, when a large-sized fan cannot be installed or a natural air cooling system is required, it is desirable to use a plate fin 7A of straight type as in the eleventh embodiment as shown in FIG. 14. Further, the tube 3 employs the straight type.

Twelfth Embodiment

Figure 15:
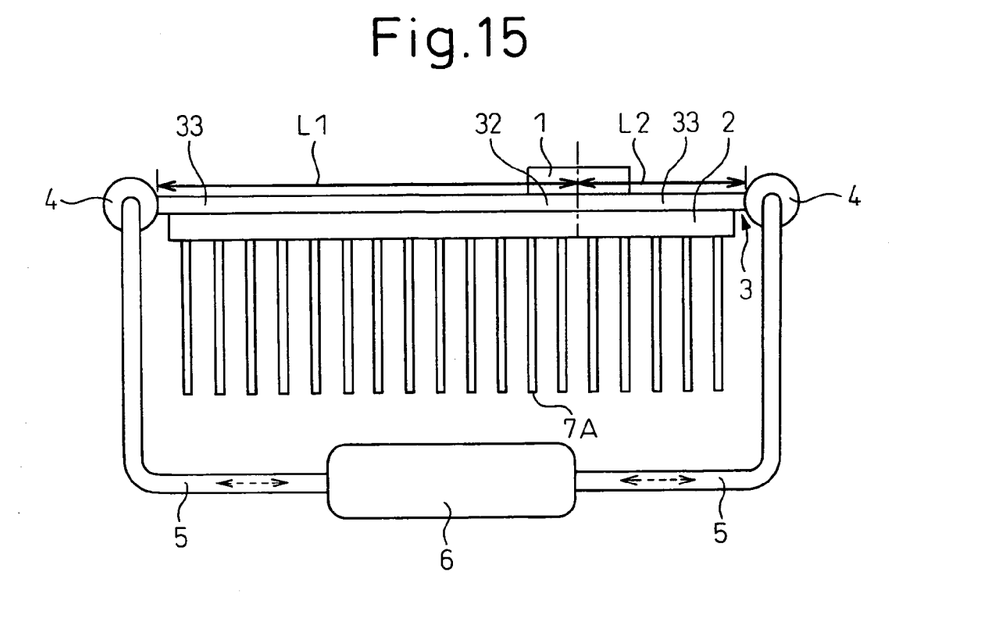
FIG. 15 is a schematic configuration diagram of a heating body cooling device according to a twelfth embodiment of the present invention.

The twelfth embodiment of the present invention is explained below. FIG. 15 is a schematic configuration diagram of a heating-body cooling device according to the twelfth embodiment. The same symbols are attached to the parts the same as or similar to those in the eleventh embodiment (refer to FIG. 14) and the explanation thereof is omitted here.

As shown in FIG. 15, in the present embodiment, the heating body 1 is arranged at a position offset toward one side in the fluid flow direction on the base plate 2. The heat transport distances L1 and L2 are different accordingly.

In this case, if the longest heat transport distance (in the present embodiment, L1) is employed as the maximum heat transport distance Lmax, the cooling performance can be most improved and by letting S>=Lmax, it is possible to improve the cooling performance to the same level as that of the circulation flow type cooling device.

Thirteenth Embodiment

Figure 16:
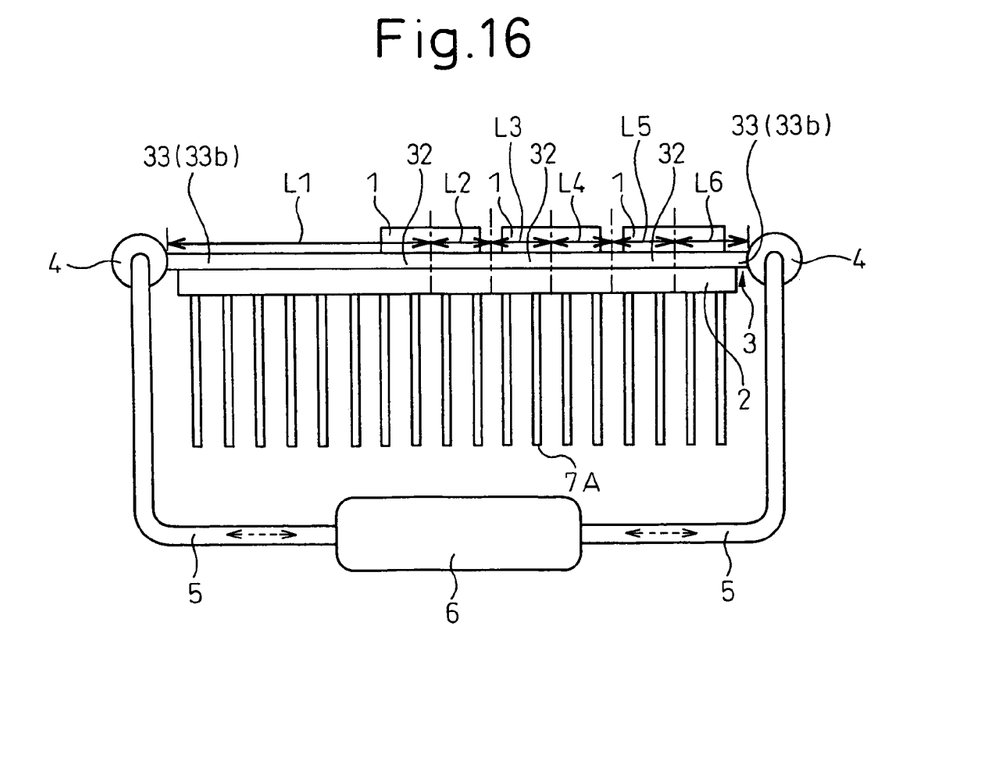
FIG. 16 is a schematic configuration diagram of a heating body cooling device according to a thirteenth embodiment of the present invention.

The thirteenth embodiment of the present invention is explained below. FIG. 16 is a schematic configuration diagram of a heating-body cooling device according to the thirteenth embodiment. The same symbols are attached to the parts the same as or similar to those in the eleventh embodiment (refer to FIG. 14) and the explanation thereof is omitted here.

As shown in FIG. 16, in the present embodiment, the heating bodies 1 are arranged at positions offset toward one side in the fluid flow direction on the base plate 2 and, at the same time, are arranged at three positions in the fluid flow direction. The heat transport distances L1 to L6 are different accordingly.

In this case, if the longest heat transport distance (in the present embodiment, L1) is employed as the maximum heat transport distance Lmax, the cooling performance can be most improved and by letting S>=Lmax, it is possible to improve the cooling performance to the same level as that of the circulation-flow-type cooling device.

While the invention has been described by reference to specific embodiments chosen for the purposes of illustration, it should be apparent that numerous modifications could be made thereto, by those skilled in the art, without departing from the basic concept and scope of the invention.

The invention claimed is:

1. A heating body cooling device comprising:
   tubes provided with a plurality of channels in parallel through which fluids flow; and
   a pump, connected to both ends of the tubes, for causing vibration flows to occur in the fluids, wherein:
      the tubes have heat absorbing sections for transferring heat of at least a heating body to the fluids and heat radiating sections located on both sides of the heat absorbing section for radiating heat of the fluids to an outside;
      the fluids vibrate with an amplitude S within the channels so as to transport heat;
      at least the heating body is arranged at one place in a fluid flow direction; and
      when a central position of the heating body in a fluid flow direction is referred to as a heating body central position, an end of the heat radiating section on an opposite side of the heat absorbing section is referred to as a heat radiating section front, distances along the fluid flows from the heating body central positions to the heat radiating section fronts are referred to as heat transport distances, and the longer one of the two heat transport distances is referred to as a maximum heat transport distance Lmax, then S>=Lmax holds.

2. A heating body cooling device comprising:
   tubes provided with a plurality of channels in parallel through which fluids flow; and
   a pump, connected to both ends of the tubes for causing vibrational flows to occur in the fluids, wherein:
      the tubes have heat absorbing sections for transferring heat of at least a heating body to the fluid and heat radiating sections located on both sides of the heat absorbing section for radiating heat of the fluids to an outside;
      the fluids vibrate with an amplitude S within the channels so as to transport heat;
      at least the heating body is arranged at one place in a fluid flow direction; and
      when a central position of the heating body in a fluid flow direction is referred to as a heating body central position, an end of the heat radiating section on a opposite side of the heat absorbing section is referred to as a heat radiating section front, distances along fluid flows from the heating body central positions to the heat radiating section fronts are referred to as heat transport distances, and the longer one of the two heat transport distances is referred to as a maximum heat transport distance Lmax, then S>=0.7 Lmax holds.

3. A heating body cooling device comprising:
   tubes provided with a plurality of channels in parallel through which fluids flow; and
   a pump, connected to both ends of the tubes, for causing vibrational flows to occur in the fluids, wherein:
      the tubes have heat absorbing sections for transferring heat of heating bodies to the fluids and heat radiating sections located on both sides of the heat absorbing section for radiating heat of the fluids to an outside;
      the fluids vibrate with an amplitude S within the channels so as to transport heat;
      the heating bodies are arranged at plural places in the fluid flow direction; and
      when the central position of each heating body in the fluid flow direction is referred to as a heating body central position, the central position of the heat radiating sections, among the heat radiating sections, located between the neighboring heating bodies in the fluid flow direction is referred to as a heat radiating section central position, the end of the heat radiating section, among the heat radiating sections, connected to the pump on the opposite side of the heat absorbing section is referred to as a heat radiating section front, the distance along a fluid flow from the heating body central position to the heat radiating section central position and the distance along a fluid flow from the heating body central position to the heat radiating section front are referred to as heat transport distances, and the longest one of the plural heat transport distances is referred to as a maximum heat transport distance Lmax, then S>=Lmax holds.

4. A heating body cooling device comprising:
tubes provided with a plurality of channels in parallel through which fluids flow; and
a pump, connected to both ends of the tubes, for causing vibrational flows to occur in the fluids, wherein:
the tubes have heat absorbing sections for transferring heat of heating bodies to the fluids and heat radiating sections located on both sides of the heat absorbing section for radiating heat of the fluids to an outside;
the fluids vibrate with an amplitude S within the channels so as to transport heat;
the heating bodies are arranged at plural places in a fluid flow direction; and
when a central position of each heating body in a fluid flow direction is referred to as a heating body central position, a central position of the heat radiating sections, among the heat radiating sections, located between the neighboring heating bodies in a fluid flow direction is referred to as a heat radiating section central position, an end of the heat radiating section, among the heat radiating sections, connected to the pump on an opposite side of the heat absorbing section is referred to as a heat radiating section front, a distance along a fluid flow from the heating body central position to the heat radiating section central position and a distance along a fluid flow from the heating body central position to the heat radiating section front are referred to as a heat transport distance, and the longest one of the plural heat transport distances is referred to as a maximum heat transport distance Lmax, then $S >= 0.7 \, L_{max}$ holds.

5. The heating body cooling device as set forth in claim 1, wherein there exist portions at which fluids vibrate in the same phase in neighboring channels among the plurality of channels.

6. The heating body cooling device as set forth in claim 1, wherein it comprises headers, provided between the tubes and the pump, for making the plurality of channels communicate with the pump and separators each of which divides an internal space of the header into plural spaces are provided within the headers.

7. The heating body cooling device as set forth in claim 2, wherein there exist portions at which fluids vibrate in the same phase in neighboring channels among the plurality of channels.

8. The heating body cooling device as set forth in claim 2, wherein it comprises headers, provided between the tubes and the pump, for making the plurality of channels communicate with the pump and separators each of which divides an internal space of the header into plural spaces are provided within the headers.

9. The heating body cooling device as set forth in claim 3, wherein there exist portions at which fluids vibrate in the same phase in neighboring channels among the plurality of channels.

10. The heating body cooling device as set forth in claim 3, wherein it comprises headers, provided between the tubes and the pump, for making the plurality of channels communicate with the pump and separators each of which divides an internal space of the header into plural spaces are provided within the headers.

11. The heating body cooling device as set forth in claim 4, wherein there exist portions at which fluids vibrate in the same phase in neighboring channels among the plurality of channels.

12. The heating body cooling device as set forth in claim 4, wherein it comprises headers, provided between the tubes and the pump, for making the plurality of channels communicate with the pump and separators each of which divides an internal space of the header into plural spaces are provided within the headers.

* * * * *